United States Patent [19]

Hyde

[11] Patent Number: 4,732,794
[45] Date of Patent: Mar. 22, 1988

[54] PORCELAIN ENAMEL COMPOSITION AND SUBSTRATES COATED THEREWITH

[75] Inventor: Robert L. Hyde, Owings Mills, Md.

[73] Assignee: Mobay Corporation, Pittsburgh, Pa.

[21] Appl. No.: 914,222

[22] Filed: Oct. 2, 1986

[51] Int. Cl.$^4$ ............... B32B 3/00; B32B 15/00; C03C 8/00; C03C 3/078
[52] U.S. Cl. ................ 428/210; 428/432; 428/901; 501/14; 501/72; 501/73
[58] Field of Search ............... 501/14, 72, 73; 428/138, 209, 210, 432, 401

[56] References Cited

U.S. PATENT DOCUMENTS

| | | | |
|---|---|---|---|
| 3,397,076 | 8/1968 | Little et al. | 117/70 |
| 3,840,394 | 10/1974 | Eppler | 117/125 |
| 3,904,423 | 9/1975 | Guthrie . | |
| 4,256,796 | 3/1981 | Hang et al. | 428/210 |
| 4,355,114 | 10/1982 | Hang et al. | 501/5 |
| 4,355,115 | 10/1982 | Hang et al. | 501/21 |

FOREIGN PATENT DOCUMENTS

| | | | |
|---|---|---|---|
| 420585 | 11/1974 | U.S.S.R. | 501/14 |
| 667513 | 6/1979 | U.S.S.R. | 501/14 |

Primary Examiner—John E. Kittle
Assistant Examiner—Patrick J. Ryan
Attorney, Agent, or Firm—Gene Harsh; Joseph C. Gil; Lyndanne M. Whalen

[57] ABSTRACT

A partially devitrified porcelain enamel composition is formed by melting an oxide mixture in which 20–50 wt % BaO, 30–60 wt % $SiO_2$, and 2–20 wt % $TiO_2$ are present to form a homogeneous melt, quenching the melt to form a frit and firing the frit. The oxide mixture may optionally include $K_2O$, $Na_2O$, $Li_2O$, $Al_2O_3$, $B_2O_3$, $As_2O_3$, CaO, $CeO_2$, MgO, $F_2$, $N_2O_5$, PbO, $P_2O_5$, $Sb_2O_3$, $SnO_2$, SrO, ZnO, $ZrO_2$, and $MoO_3$. Metal substrates coated with such a partially devitrified porcelain enamel composition are particularly suitable for the production of electronic circuits.

10 Claims, No Drawings

PORCELAIN ENAMEL COMPOSITION AND SUBSTRATES COATED THEREWITH

BACKGROUND OF THE INVENTION

The present invention relates to a porcelain enamel composition useful in coating a metal substrate, to metal substrates coated therewith, and a process for the production of such coated substrates.

In the production of electronic components directly on the surface of a substrate, conductive and resistive inks made up of metal and glass powder are applied in the desired pattern to a substrate coated with an insulating material. The thus-printed component is then fired at elevated temperature to fuse the materials in the ink and form the desired electronic component. The required firing temperatures generally range from 600° to 900° C.

In view of the temperatures to which the coated substrate is subjected, substrates suitable for the production of electronic components must be able to withstand elevated temperatures without being physically changed. The substrates generally employed are metals such as steel or copper or aluminum. The compositions with which these substrates are coated are generally porcelain enamels but the specific composition of these enamels has varied greatly.

Some porcelain enamel coatings have been found to be unsatisfactory because upon firing, the porcelain does not fuse into a layer of uniform thickness. This lack of uniformity makes it difficult to accurately print circuits on the coated surface.

Other porcelain enamels resoften and reflow when subjected to refiring resulting in distortion or even destruction of the printed circuit.

Another major problem which has been encountered with metal substrates coated with porcelains is poor adhesion. This adhesion problem is due largely to the substantial difference in the coefficient of thermal expansion of the metal substrate and the porcelain enamel coating.

Attempts to resolve these problems have not yet been completely successful.

Examples of specific known coating compositions may be found in U.S. Pat. Nos. 3,904,423 and 4,256,796.

SUMMARY OF THE INVENTION

It is an object of the present invention to provide a new porcelain enamel composition useful in the production of electronic components or printed circuit boards.

It is also an object of the present invention to provide a porcelain enamel composition which fuses into a layer of uniform thickness, does not soften when subjected to refiring and has a coefficient of thermal expansion close to that of the metal core to which it is applied.

It is a further object of the present invention to provide porcelain enamel coated metal substrates having a uniform surface and good metal-to-enamel adhesion and a process for the production of such coated substrates.

These and other objects which will be apparent to those skilled in the art are accomplished by melting a glass having specified oxides present within specified amounts to form a homogeneous molten mixture. The molten mixture is quenched and the frit thus-formed is ground to a fine particle size in water to form an enamel slip. A metal substrate is coated with this slip and the coated part is fired.

DETAILED DESCRIPTION OF THE INVENTION

The partially devitrified porcelain enamel compositions of the present invention are made from at least three required oxides. These required oxides are (1) barium oxide which is present in an amount from 20–50 weight percent, preferably 25–45 weight percent of the total composition; (2) silica which is present in an amount of from 30–60 weight percent, preferably 35–50 weight percent of the total composition and (3) titanium dioxide which is present in an amount of from 2–20 weight percent, preferably 4–10 weight percent of the total composition. The barium oxide, silica and titanium dioxide produce the crystalline phase of the partially devitrified porcelain enamel compositions of the present invention. Selection of specific amounts of these oxides within the required ranges is dependent upon the amount of crystallization, melting point of the frit, coefficient of thermal expansion and rate of crystallization desired.

Optional oxides which are preferably included are: (4) potassium oxide which may be present in an amount of from 0 to 16 weight percent, preferably 0–12 weight percent of the total composition: (5) zinc oxide which may be present in an amount of from 0 to 7 weight percent, preferably 0–5 weight percent of the total composition: (6) lithium oxide which may be present in an amount of from 0 to 4 weight percent of the total composition; (7) alumina which may be present in an amount of from 0 to 10 weight percent, preferably 2–8 weight percent of the total composition; (8) magnesium oxide which may be present in an amount of from 0–10 weight percent, preferably 0–5 weight percent of the total composition: (9) calcium oxide which may be present in an amount of from 0–10 weight percent, preferably 0–5 weight percent of the total composition: (10) strontium oxide which may be present in an amount of from 0–10 weight percent, preferably 0–5 weight percent of the total composition: (11) zirconium dioxide which may be present in an amount of from 0–10 weight percent, preferably 0–5 weight percent of the total composition: and (12) 0–4 weight percent of sodium oxide based on the total composition.

Other materials which may be included to modify the devitrification, fired surface, oxidation state or thermal characteristics of the composition are: $As_2O_3$, $B_2O_3$, $CeO_2$, $F_2$, $N_2O_5$, PbO, $P_2O_5$, $Sb_2O_3$, $SnO_2$, and $MoO_3$. However, not one of these materials should be present in an amount greater than 3 weight percent of the total composition.

Lithium oxide, sodium oxide and/or potassium oxide make it possible to control melting of the oxide mixture being used to produce the frit. These oxides also affect the degree of thermal expansion of the enamels of the present invention to some extent. A combination of these oxides results in an enamel composition having better electrical properties than compositions made with only one of them.

The other oxides listed above may be used in amounts within the given ranges to affect crystallization, melting temperature, glass viscosity and electrical properties in known manner.

The above-listed oxides or a material which forms these oxides upon being heated to melt (e.g. magnesium carbonate, barium carbonate) are mixed in quantities such that the total weight percent of the mixture is approximately 100 weight percent. Techniques which ensure homogeneity of the mixture and methods for removing any moisture present are known in the art and may be advantageously employed in the production of the composition of the present invention.

The mixture of oxides and/or materials which form those oxides is melted using conventional glass melting methods. The mixture is gradually heated to 1300°–1500° C., preferably 1370°–1470° C. and the resultant molten material is maintained at this temperature until a homogeneous melt is obtained. Appropriate melt times range from 20 minutes to several hours depending upon the equipment used, the amount of material being melted and the specific frit composition.

The homogeneous melt is then converted to a glass frit by quenching. Methods for quenching such a melt are known in the art. In one such method, a stream of the molten glass is poured over a set of spaced apart counter revolving water chilled rollers to provide a thin ribbon of solidified glass. The resulting glass is then crushed. The crushed glass or frit is then added to a ball mill together with water, suspension agents and any optional mill additives where the glass or frit is ground to a uniform particle size. Particle sizes of from 5–50 $\mu$m, preferably from 5 to 25 $\mu$m are particularly suitable. Appropriate suspension agents and mill additives are known to those skilled in the art.

Upon removal from the mill, more water may be added to the enamel slip. It is preferred that the slip be diluted to a specific gravity of 1.50 to 1.80. It is this slip or diluted slip which is used to coat a metal substrate.

Many types of metals and alloys can be coated with a porcelain enamel. Low carbon steels are however the most frequently used substrates. Stainless steel alloys may be coated for special applications. If aluminum or aluminum based material is to be coated, that material must have a low melting temperature (i.e. 550°–650° C.).

Low carbon steels are the most frequently used substrates in the practice of the present invention for several reasons. For example, in one-coat, direct to steel, cover coat porcelain enamel coatings, extra low carbon steel (i.e. carbon content$\leq$0.003 weight %) does not give off gaseous carbon oxide which may cause defects (e.g. bubbles or pores) in the enamel coating. Low carbon steels typically have a coefficient of thermal expansion of about $14 \times 10^{-6}/°$ C. which is approximately the same as that for the porcelain enamel compositions of the present invention. Other types of alloys having coefficients of thermal expansion which are substantially different from that of low carbon steel require different enamel coatings with coefficients of thermal expansion compatible with the specific alloy.

Prior to being coated with enamel slip, an appropriate metal substrate is cut, formed or shaped into the desired configuration.

Many methods for coating a substrate are known in the art but electrophoretic deposition is the preferred method. In this method, the enamel slip is placed in a suitable electrolytic tank. A nickel or stainless steel plate is used as the anode and the metal substrate to be coated is placed in the cathode position. Electric current is passed through the enamel slip in a conventional manner. The glass particles in the suspension deposit on the surface of the metal article. The thickness of the coating is dependent upon the concentration of particles in the enamel slip, the current density and the time of deposition. When the desired coating thickness has been deposited on the metal substrate, the coated substrate is removed from the enamel slip, allowed to drain, is briefly rinsed and is then dried at elevated temperature (about 100° C.). The coated substrate has a uniform coating over the entire surface.

The coated substrate is then placed directly into a furnace maintained at a temperature of from 800° to 900° C., preferably about 900° C. The initial temperature of firing must be sufficiently high that the coating melts and undergoes devitrification almost simultaneously. A temperature of about 800° C. is generally sufficient but a temperature of about 900° C. permits more rapid devitrification. The coated substrate is subjected to these firing conditions until devitrification is substantially complete. The firing time is dependent upon the firing temperature and composition of the specific coating.

The coating undergoes a rapid change as it is fired. When the frit particles melt recrystallization begins and the viscosity of the melt increases rapidly. Devitrification occurs quickly during firing and then stops. No further devitrification takes place during refire. The coating becomes continuous, assumes a smooth surface appearance and almost immediately acquires a flat matte-like appearance. The finished fired coated substrate has a uniform coat on the entire surface.

The fired porcelain enamel has a melting temperature higher than 900° C. and contains the crystalline phase $2BaO.TiO_2.2SiO_2$. The fired coating contains both crystalline material and vitreous glass. The proportion of crystalline material to vitreous glass is dependent upon both the particular frit and the firing conditions.

The fired porcelain enamel has a high coefficient of thermal expansion (i.e. from 9 to $15 \times 10^{-6}/°$ C.) which makes it compatible with all of the steels commonly used for enamelling substrates. It is this compatibility of coefficient of thermal expansion which eliminates or substantially reduces the tendency of the coated substrate to fracture upon repeated refiring.

The coated substrates of the present invention are particularly useful in the production of components for circuits. These coated substrates (i.e. circuit boards) have flat surfaces which can be readily and accurately printed. After printing, the circuit board is repeatedly fired at temperatures of from 600° to 950° C., preferably about 900° C. to fuse the printing into the desired process induced electronic components. The specific firing temperature is dependent upon the type of thick film ink being used. Most of the inks commonly used by those in the art are fired at a temperature of from 800° to 850° C. Certain copper inks however require firing temperatures of from 900° to 950° C.

Other advantageous properties of these coated substrates include: high electric resistivity, low dielectric loss and low water solubility.

The following examples are given to further illustrate this invention and are not intended to limit the scope of the invention. The ranges given are in percent by weight, unless otherwise indicated.

EXAMPLES

EXAMPLE 1

A glass frit was formed by quenching with water a homogeneous melt formed from the following mixture of oxides:

| | |
|---|---|
| $K_2O$ | 13 wt % |
| BaO | 33 wt % |

-continued

| | |
|---|---|
| SiO2 | 37.6 wt % |
| Na2O | 3.3 wt % |
| Al2O3 | 6.0 wt % |
| TiO2 | 7.0 wt % |
| As2O3 | 0.1 wt % |
| N2O3 | 1.25 wt % |

The frit was ground to an average particle size of about 25 μm in the presence of water and clay (a suspension agent) to form an enamel slip having a glass frit composition of about 66%. Additional water was added to dilute this slip. The slip was then applied to extra low carbon steel (carbon content approximately 0.003 wt %) which had been cleaned, etched with sulfuric acid and nickel flashed. The coated substrate was then fired at a temperature of 900° C. for 15 minutes. The fired substrate had a uniform coating of 5-8 mils thickness. The coating contained the crystalline phases 2BaOTiO2. 2SiO2 in substantial amounts, had a coefficient of thermal expansion of $12.6 \times 10^{-6}/°$ C. (50°-450° C.) and a softening point of greater than 925° C.

EXAMPLES 2-36

The procedure used in Example 1 was repeated using each of the oxide mixtures described in Table 1. The amount of oxide used is indicated in parts by weight. The properties of the coatings and coated substrates made with each of the frits formed from the oxide mixtures summarized in Table 1 are reported in Table 2.

Fineness is either the measured fineness on a 325 mesh screen or the mean particle size. The specific gravity which was measured determines the viscosity and the degree of settling of particles in the slip. pH and conductivity (in μmhos) were determined and adjusted so that the best electrophoretic deposition could be achieved. Opacity is the measure of the degree of crystallization. Expansion was determined by observation. Spalling or chippage of the coating on the edges of the panel indicate a coating expansion that was too low while crazing of the coating indicates an expansion that was too high. The softening point is determined on the basis of observation.

TABLE 1

| Example No. | SiO2 | BaO | TiO2 | K2O | Li2O | Na2O | N2O5 | As2O3 | Al2O3 | Mgo | ZnO | ZrO2 | B2O3 | P2O5 | MoO3 |
|---|---|---|---|---|---|---|---|---|---|---|---|---|---|---|---|
| 1 | 37.6 | 33.0 | 7.0 | 13.0 | | 3.3 | 1.25 | 0.1 | 6.0 | | | | | | |
| 2 | 38.0 | 38.8 | 16.2 | 1.5 | | 3.3 | 1.25 | | | | | | 2.2 | | |
| 3 | 46.4 | 33.0 | 8.6 | 9.0 | | 3.0 | 1.25 | | | | | | | | |
| 4 | 36.0 | 30.0 | 7.0 | 11.0 | | 3.0 | 1.25 | | 8.0 | | 5.0 | | | | |
| 5 | 36.0 | 33.0 | 7.0 | 13.0 | | 3.3 | 1.25 | 0.1 | 7.6 | | | | | | |
| 6 | 40.0 | 34.8 | 18.2 | 1.5 | | 3.3 | 1.25 | | | | | | 2.2 | | |
| 7 | 38.9 | 33.0 | 7.0 | 16.0 | | | 1.25 | 0.1 | 5.0 | | | | | | |
| 8 | 43.9 | 33.0 | 7.0 | 16.0 | | | 1.25 | 0.1 | | | | | | | |
| 9 | 38.9 | 33.0 | 7.0 | 15.0 | | | 1.25 | 0.1 | 5.0 | | | | | 1.0 | |
| 10 | 42.4 | 32.0 | 7.0 | 16.0 | | | 1.25 | 0.1 | 2.5 | | | | | | |
| 11 | 37.0 | 50.0 | 10.9 | | 2.0 | | | 0.1 | | | | | | | |
| 12 | 42.0 | 46.2 | 9.7 | | 2.0 | | | 0.1 | | | | | | | |
| 13 | 49.0 | 40.1 | 8.8 | | 2.0 | | | 0.1 | | | | | | | |
| 14 | 43.0 | 42.9 | 9.0 | | 2.0 | | | 0.1 | | | | | | 3.0 | |
| 15 | 37.0 | 46.2 | 9.7 | | 2.0 | | | 0.1 | | | 5.0 | | | | |
| 16 | 44.0 | 42.9 | 11.0 | | 2.0 | | | 0.1 | | | | | | | |
| 17 | 46.0 | 41.1 | 10.8 | | 2.0 | | | 0.1 | | | | | | | |
| 18 | 41.0 | 41.1 | 10.8 | | 2.0 | | | 0.1 | | | | 5.0 | | | |
| 19 | 45.5 | 42.5 | 8.9 | | 3.0 | | | 0.1 | | | | | | | |
| 20 | 47.0 | 24.9 | 7.0 | 16.0 | | | 1.25 | 0.1 | 5.0 | | | | | | |
| 21 | 43.9 | 30.0 | 6.0 | 16.0 | | | 1.25 | 0.1 | 4.0 | | | | | | |
| 22 | 44.4 | 33.0 | 8.5 | 14.0 | | | 1.25 | 0.1 | | | | | | | |
| 23 | 44.4 | 30.0 | 8.5 | 14.0 | | | 1.25 | 0.1 | 3.0 | | | | | | |
| 24 | 40.0 | 23.9 | 15.0 | 16.0 | | | 1.25 | 0.1 | 5.0 | | | | | | |
| 25 | 43.0 | 33.9 | 15.0 | 1.0 | 2.0 | | 1.15 | 0.1 | 5.0 | | | | | | |
| 26 | 44.2 | 41.2 | 8.5 | 3.0 | 3.0 | | | 0.1 | | | | | | | |
| 27 | 45.0 | 28.9 | 10.0 | 16.0 | | | 1.25 | 0.1 | | | | | | | |
| 28 | 44.0 | 27.9 | 7.0 | 16.0 | | | 1.25 | 0.1 | | 5.0 | | | | | |
| 29 | 42.0 | 32.0 | 6.9 | 12.0 | 1.0 | | 1.25 | 0.1 | 2.7 | 3.0 | | | | | |
| 30 | 41.7 | 32.0 | 6.9 | 12.0 | 1.0 | | 1.25 | 0.1 | 2.7 | 3.0 | | | | | 0.3 |
| 31 | 43.4 | 40.5 | 8.3 | 4.7 | 3.0 | | | 0.1 | | | | | | | |
| 32 | 40.0 | 33.0 | 6.9 | 15.0 | | | 1.25 | 0.1 | 2.5 | 2.5 | | | | | |
| 33 | 41.5 | 33.0 | 6.9 | 11.5 | 2.0 | | 1.25 | 0.1 | 2.5 | 2.5 | | | | | |
| 34 | 40.5 | 32.0 | 5.9 | 11.5 | 2.0 | | 1.25 | 0.1 | 2.5 | 2.5 | 3.0 | | | | |
| 35 | 41.0 | 33.0 | 6.9 | 11.5 | 2.0 | | 1.25 | 0.1 | 2.5 | 2.5 | | | | | 0.5 |
| 36 | 43.0 | 33.0 | 6.9 | 10.0 | 2.0 | | 1.25 | 0.1 | 5.0 | | | | | | |

TABLE 2

| Example No. | Fineness | Specific Gravity | Slip PH/Conductivity (μmhos) | Steel[a] Type | Deposition Seconds/Volts | Heat Treatment | Surface Appearance | Opacity | Coating Thickness (mils) | Relative Expansion | Estimated[b] Softening Point |
|---|---|---|---|---|---|---|---|---|---|---|---|
| 1 | 0.6%/325 | 1.706 | 12.3/4850 | CL-ELC | 30/40 | 30'/900° C. | Fair | High | 7.7 | OK | Moderate |
| 2 | 1.0%/325 | 1.708 | 11.7/2350 | P-PC | 20/40 | 30'/890° C. | Smooth | High | 7-8 | Low | High |
| 3 | 1.0%/325 | 1.697 | 11.8/2550 | P-ELC | 30/30 | 30'/900° C. | Glossy | High | 8-3 | OK | Low |
| 4 | 1.5%/325 | 1.685 | 11.8/2700 | P-PC | 25/40 | 30'/900° C. | Rough | High | 7.0 | Low | Moderate |
| 5 | 1.2%/325 | ~1.700 | 12.0/2970 | P-PC | 30/40 | 30'/900° C. | Rough | High | 7.0 | OK | Moderate |
| 6 | 1.2%/325 | 1.883 | 12.2/3100 | P-PC | 40/40 | 30'/890° C. | Rough | High | 5.5 | Low | High |
| 7 | 4.2%/325 | ~1.700 | 12.0/2700 | P-PC | 25/40 | 15'/900° C. | | High | 9.0 | OK | Moderate |
| 8 | | Sprayed Only | | ELC | | 15'/900° C. | | Low | — | OK | |
| 9 | 1.8%/325 | 1.680 | 11.7/2700 | P-PC | 20/40 | 15'/900° C. | Rough/Tearing | High | 7 | OK | High |
| 10 | — | Sprayed Only | | ELC | — | 15'/900° C. | — | Low | — | OK | |
| 11 | | | | | | | | High | | | High* |
| 12 | | | | | | | | High | | | High* |
| 13 | | | | | | | | High | | | High* |
| 14 | | | | | | | | High | | | High* |
| 15 | | | | | | | | High | | | High* |
| 16 | | | | | | | | High | | | High* |
| 17 | | | | | | | | High | | | High* |
| 18 | | | | | | | | High | | | High |
| 19 | 12 μm | 1.690 | 11.8/2480 | P-ELC | 20/40 | 15'/900° C. | Rough/Tearing | High | 6-7 | Slightly Low | ** |
| 20 | | | | | | | | | | | |
| 21 | — | Sprayed Only | | ELC | | 15'/900° C. | | Moderate | | OK | |
| 22 | — | Sprayed Only | | ELC | | 15'/900° C. | | Low | | Low | |
| 23 | — | Sprayed Only | | ELC | | 15'/900° C. | | Moderate | | Low | |
| 24 | 12 μm | 1.615 | 12.1/3170 | P-ELC | 30/40 | 15'/900° C. | Smooth | Moderate | 6.2 | Low | Moderate |
| 25 | | | | | | | | High | | Low | * |
| 26 | | | | | | | | High | | Low | * |
| 27 | | | | | | | | Low | | | |
| 28 | | | | | | | | Low | | | |
| 29 | 12 μm | 1.692 | 12.0/2160 | P-PC | 20/50 | 15'/900° C. | Glossy/Bumpy | High | 6 | High | Moderate |
| 30 | 0.8%/325 | 1.752 | 12.0/2100 | P-CM-PC | 25/50 | 10'/900° C. | Fair to Good | High | 6 | High | Moderate |
| 31 | 4%/325 | 1.717 | 11.4/2380 | P-PC | 20/40 | 5'/900° C. | Glossy/Rough | Moderate | 5.6 | Low | Moderate |
| 32 | 12 μm | 1.619 | 12.1/3780 | P-PC | 20/40 | 10'/900° C. | Smooth/Tearing | High | 6-7 | OK | Moderate |
| 33 | 0.8%/325 | 1.664 | 11.9/2010 | P-CM-PC | 20/50 | 10'/900° C. | Defects | Moderate | 7 | OK | Moderate |
| 34 | 1%/325 | 1.680 | 12.3/3140 | P-ELC | 20/65 | 15'/900° C. | Smooth | Moderate | 6.5 | OK | High |
| 35 | 1.6%/325 | 1.693 | 12.0/2190 | P-PC | 20/40 | 15'/900° C. | Bumpy | High | 7-8 | OK | Moderate |
| 36 | 0.7%/325 | Not Checked | 11.9/2100 | P-CM-PC | 20/50 | 15'/900° C. | Defects/Rough | High | 6-8 | Low | Moderate |

[a]P = Pickled
CO = Cleaned - Only
CM = Chemically Milled
PC = Printed Circuit
ELC = Extra Low Carbon
[b]Low - ~875° C.
Moderate - 875 - ~925° C.
High - >925° C.
*Melting Point Very High
**Composition would not melt completely Although the invention has been described in detail in the foregoing for the purpose of illustration, it is to be understood that such detail is solely for that purpose and that variations can be made therein by those skilled in the art without departing from the spirit and scope of the invention except as it may be limited by the claims.

What is claimed is:

1. A partially devitrified porcelain enamel composition formed by melting a mixture of materials which upon melting form an oxide mixture consisting essentially of:
   (a) 20–50 wt % BaO
   (b) 30–60 wt % $SiO_2$
   (c) 2–20 wt % $TiO_2$
   (d) 0–16 wt % $K_2O$
   (e) 0–4 wt % $Na_2O$
   (f) 0–4 wt % $Li_2O$
   (g) 0–10 wt % $Al_2O_3$
   (h) 0–3 wt % $B_2O_3$
   (i) 0–3 wt % $As_2O_3$
   (j) 0–10 wt % CaO
   (k) 0–3 wt % $CeO_2$
   (l) 0–10 wt % MgO
   (m) 0–3 wt % $F_2$
   (n) 0–3 wt % $N_2O_5$
   (o) 0–3 wt % PbO
   (p) 0–3 wt % $P_2O_5$
   (q) 0–3 wt % $Sb_2O_3$
   (r) 0–3 wt % $SnO_2$
   (s) 0–10 wt % SrO
   (t) 0–7 wt % ZnO
   (u) 0–10 wt % $ZrO_2$ and
   (v) 0–3 wt % $MoO_3$
with the total weight percent being approximately 100 wt % to form a homogeneous melt, quenching the melt to form a frit and firing the frit.

2. The composition of claim 1 in which the molten mixture contains
   (a) 25–45 wt % BaO
   (b) 35–50 wt % $SiO_2$ and
   (c) 4–10 wt % $TiO_2$ 3. The composition of claim 2 in which the molten mixture further contains
   (d) 0–12 wt % $K_2O$
   (g) 2–8 wt % $Al_2O_3$
   (j) 0–5 wt % CaO
   (l) 0–5 wt % MgO
   (s) 0–5 wt % SrO
   (t) 0–5 wt % ZnO and
   (w) 0–5 wt % $ZrO_2$ 4. The composition of claim 1 in which at least two of the oxides selected from $Li_2O$, $Na_2O$, and $K_2O$ are present in the melt.

5. The composition of claim 1 in which the molten mixture contains
   (a) 33 wt % BaO
   (b) 37.6 wt % $SiO_2$
   (c) 7.0 wt % $TiO_2$
   (d) 13 wt % $K_2O$
   (e) 3.3 wt % $Na_2O$
   (g) 6.0 wt % $Al_2O_3$
   (i) 0.1 wt % $As_2O_3$ and
   (n) 1.25 wt % $N_2O_5$ 6. A coated substrate suitable for the production of electronic circuits which is a metal substrate coated with the partially devitrified porcelain enamel of claim 1.

7. A coated substrate suitable for the production of electronic circuits which is a metal substrate coated with the partially devitrified porcelain enamel of claim 2.

8. A coated substrate suitable for the production of electronic circuits which is a metal substrate coated with the partially devitrified porcelain enamel of claim 3.

9. A coated substrate suitable for the production of electronic circuits which is a metal substrate coated with the partially devitrified porcelain enamel of claim 4.

10. A coated substrate suitable for the production of electronic circuits which is a metal substrate coated with the partially devitrified porcelain enamel of claim 5.

* * * * *